United States Patent [19]
Sung

[11] Patent Number: 6,008,084
[45] Date of Patent: Dec. 28, 1999

[54] METHOD FOR FABRICATING LOW RESISTANCE BIT LINE STRUCTURES, ALONG WITH BIT LINE STRUCTURES EXHIBITING LOW BIT LINE TO BIT LINE COUPLING CAPACITANCE

[75] Inventor: Janmye Sung, Yang-Mei, Taiwan

[73] Assignee: Vanguard International Semiconductor Corporation, Hsin-Chu, Taiwan

[21] Appl. No.: 09/031,651

[22] Filed: Feb. 27, 1998

[51] Int. Cl.⁶ .................. H01L 21/8242; H01L 21/20
[52] U.S. Cl. .................. 438/241; 438/253; 438/396
[58] Field of Search .................. 438/241, 242, 438/253, 256, 396

[56] References Cited

U.S. PATENT DOCUMENTS

| | | | |
|---|---|---|---|
| 4,944,836 | 7/1990 | Beyer et al. | 156/645 |
| 5,045,899 | 9/1991 | Arimoto | 357/23.6 |
| 5,550,078 | 8/1996 | Sung | 437/52 |
| 5,550,769 | 8/1996 | Hidaka et al. | 365/63 |
| 5,783,470 | 7/1998 | Rostoker | 438/253 |
| 5,858,831 | 1/1999 | Sung | 438/241 |
| 5,930,624 | 7/1999 | Murata et al. | 438/253 |

OTHER PUBLICATIONS

C.Y. Chang & S.M. Sze, "VLSI Technology", The McGraw–Hill Company, Inc, c. 1997. p. 444–5.

*Primary Examiner*—John F. Niebling
*Assistant Examiner*—Michael S. Lebentritt
*Attorney, Agent, or Firm*—George O. Saile; Stephen B. Ackerman

[57] ABSTRACT

A process for fabricating a DRAM chip, featuring low resistance bit line structures, in a peripheral region, and a cell array containing bit line structures exhibiting low bit line to bit line coupling capacitance, has been developed. The process features creating a first damascene opening, in insulator layers in the peripheral region of the DRAM cell, in which the top portion of the first damascene opening is comprised of a deep trench shape, allowing for low resistance bit line structures, when filled with a conductive material. The process also features the creation of second damascene openings, in an insulator layer in the cell array region of the DRAM chip, with the top portion of the second damascene openings exhibiting a shallow trench shape, again allowing bit line structures to be created after filling again with a conductive layer, but with low bit line to bit line coupling capacitance, achieved as a result of the thin metal fill, in the shallow trench opening.

22 Claims, 8 Drawing Sheets

METHOD FOR FABRICATING LOW RESISTANCE BIT LINE STRUCTURES, ALONG WITH BIT LINE STRUCTURES EXHIBITING LOW BIT LINE TO BIT LINE COUPLING CAPACITANCE

BACKGROUND OF THE INVENTION (1) Field of the Invention

The present invention relates to methods used to fabricate semiconductor devices, and more specifically to a method used to form bit line structures for a dynamic random access memory, (DRAM), chip.

(2) Description of Prior Art

The semiconductor industry is continually striving to reduce the cost of semiconductor chips, while still maintaining, or even decreasing, the cost of the specific chip. The use micro-miniaturization, or the ability to fabricate semiconductor devices, with sub-micron features, have allowed chip cost, and chip performance, to be successfully addressed. The use of sub-micron features has resulted in decreases in performance degrading parasitic capacitances, while also allowing a greater number of smaller chips, with device densities comparable to those obtained using larger chips, to be realized from a specific size starting substrate, thus reducing the processing cost for the smaller chip. However the tighter packing densities, used to obtain aggressive DRAM designs, such as 256 Megabytes or greater, can in some areas, negatively influence DRAM performance.

The high density, DRAM cell array, although resulting in decreased parasitic capacitances, in areas of the transfer gate transistor, can however experience degraded DRAM performance as a result of increasing coupling capacitances, in the region in which bit line structures are closely packed. This invention will offer a process for minimizing the coupling capacitance effect for high density DRAM devices. A process is described in which low bit line to bit line coupling capacitance is achieved, via use of thin bit line wiring structures, in the DRAM cell array, thus reducing the vertical capacitor component, between thin bit line structures. However the bit line wiring structures, for the peripheral devices, are fabricated using thicker metal structures, thus maintaining a low resistance bit line structure in the non-array cell regions of the DRAM chip. This process, thin bit line structures for DRAM cell array, and thicker bit line structures for the peripheral DRAM devices, is accomplished using a damascene process, in which the top portion of the damascene hole, is opened to different depths in an insulator layer, to accommodate the different thickness of bit line structures used for the array and peripherals. Hidaka et al, in U.S. Pat. No. 5,550,769, describe a bit line structure for a semiconductor memory device, however that prior art does not offer the process used in this invention, enabling low resistance, thick bit line structures, for DRAM peripheral devices, and thin bit line structures, for DRAM array devices, to be obtained.

SUMMARY OF THE INVENTION

It is an object of this invention to create a high density DRAM chip featuring low bit line to bit line coupling capacitance, in the cell array regions of the high density DRAM chip.

It is another object of this invention to create a high density DRAM chip featuring low resistance bit line structures, in the peripheral regions of the high density DRAM chips.

It is yet another object of this invention to create a deep trench shape, in the damascene bit line opening, for the low resistance bit line structures, in the peripheral regions of the high density DRAM chip, and to create a shallow trench shape, in the damascene bit line opening, for the bit line structures in the cell array regions of the high density DRAM chip, resulting in low bit line to bit line coupling capacitance.

In accordance with the present invention a process is described for fabricating a DRAM chip featuring low bit line to bit line coupling capacitance, for cell array regions, and low resistance bit line structures for peripheral regions of the DRAM chip. Transfer gate transistors, comprised of polycide gate structures, source and drain regions in the semiconductor substrate, and insulator spacers on the sides of the polycide gate structures, are fabricated in a first region of a semiconductor substrate, used for the peripheral region of the DRAM chip, and are also fabricated in a second region of the semiconductor substrate, used for the cell array region of the DRAM chip. A first insulator layer is deposited, followed by the opening of contact holes, in the first insulator layer, exposing source and drain regions, in the cell array region of the DRAM chip. Polysilicon contact plug structures are next formed in the contact holes, overlying and contacting source and drain regions, in the cell array region. Stacked capacitor structures are formed on a first set of polysilicon contact plug structures, followed by the deposition of a second insulator layer. A first patterning procedure is used to open a deep, wide trench in the top portion of the second insulator layer, in the peripheral region of the DRAM chip, followed by a second patterning procedure, used to open a shallow, wide trench in the top portion of the second insulator layer, in the cell array region of the DRAM chip. A third patterning procedure is then initiated, in the wide, deep trench opening, creating a narrow opening in the bottom portion of the second insulator layer, and in the first insulator layer, exposing the source and drain regions, of transfer gate transistors in the peripheral region of the DRAM chip, resulting in a first damascene opening featuring a narrow opening to underlying source and drain regions, extending down from an overlying, deep, wide trench opening. The same patterning procedure is performed in the bottom portion of the second insulator layer, exposed in the shallow, wide trench opening, creating a narrow opening in the second insulator layer, exposing the top surface of a second set of polysilicon contact plug structures, and resulting in a second damascene opening, featuring a narrow opening to a underlying polysilicon contact plug structure, extending down from an overlying, wide, shallow trench opening. Metal deposition and patterning, result in low resistance bit line structures, in the first damascene openings, and low bit line to bit line coupling capacitance structures, in the second damascene openings. Openings are also created in the second insulator layer, exposing the stacked capacitor structures in the cell array region, followed by formation of metal contact structures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a DRAM chip, featuring low resistance bit line structures in a peripheral region, and with bit line structures in the cell array region, featuring low bit line to bit line coupling capacitance, will now be described in detail.

Figure 1:
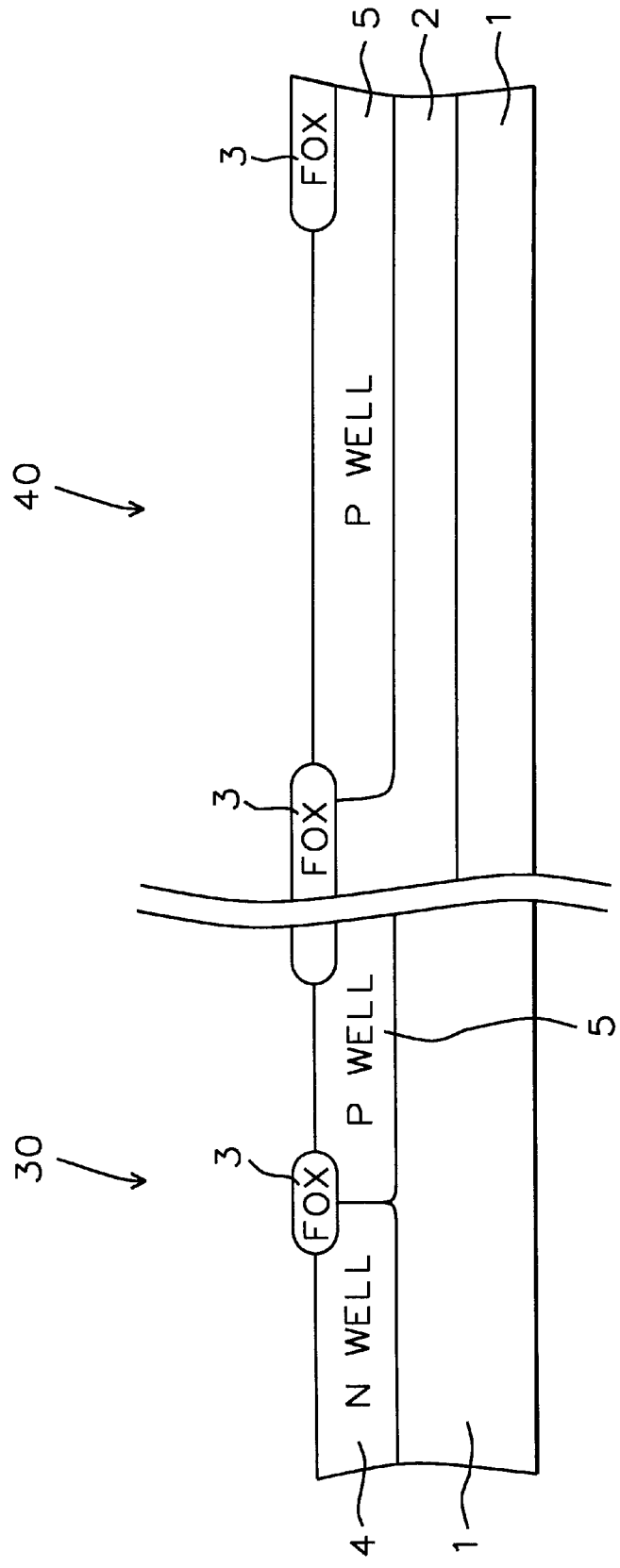
FIGS. 1–8, which schematically, in cross-sectional style, show the formation of both peripheral and cell array regions, of the DRAM chip, featuring low resistance bit line structures, in the peripheral region, and bit line structures in the cell array region, created to result in low bit line to bit line coupling capacitance.

A P type, single crystal substrate, 1, with a <100> crystallographic orientation is used, with region 30, used for peripheral devices of the DRAM chip, while region 40, of semiconductor substrate 1, will be used for the cell array devices. A N type buried layer 2, is formed in semiconductor substrate 1, for the cell array region 40. A thick field oxide region 3, (FOX), is created for purposes of isolating subsequent P channel metal oxide semiconductor field effect transistors, (MOSFET), devices, from subsequent N channel, MOSFET devices, in peripheral region 30, as well as for creating isolation regions in cell array region 40. Briefly the method used to create FOX region 3, is to pattern, via standard photolithography and dry etching procedures, a silicon nitride—silicon dioxide composite layer. After photoresist removal, and careful wet cleans, a thermal oxidation, in an oxygen—steam ambient, is performed, using the patterned silicon nitride—silicon dioxide composite layer as an oxidation mask, at a temperature between about 850 to 1050° C., to produce a silicon dioxide, FOX region 3, at a thickness between about 3000 to 6000 Angstroms. The removal of the oxidation masking composite layer is accomplished via use of hot phosphoric acid, for the silicon nitride layer, and a buffered hydrofluoric acid solution for the underlying silicon dioxide layer. This is shown in FIG. 1.

Photolithographic and ion implantation procedures are next employed to create N well region 4, in a specific region of semiconductor substrate 1, to be used for P channel MOSFET devices, in peripheral region 30. An ion implantation of arsenic, at an energy between about 100 to 300 KeV, at a dose between about 1E11 to 1E12 atoms/$cm^2$, and phosphorous, at an energy between about 400 to 1000 Kev., at a dose between about 1E12 to 1E13 atoms/$cm^2$, is used to supply the needed dopants for the creation of N well region 4. After removal of the N well, masking photoresist shape, via plasma oxygen ashing and careful wet cleans, another photolithographic and ion implantation procedure, is performed. Boron is ion implanted at an energy between about 1000 to 2000 KeV, at a dose between about 1E12 to 1E13 atoms/$cm^2$, supplying the dopants needed for the formation of P well regions 5. P well regions 5, will be used to accommodate the subsequent formation of N channel, MOSFET devices, used in both peripheral region 30, and in the cell array region 40. This is also shown schematically in FIG. 1.

Figure 2:
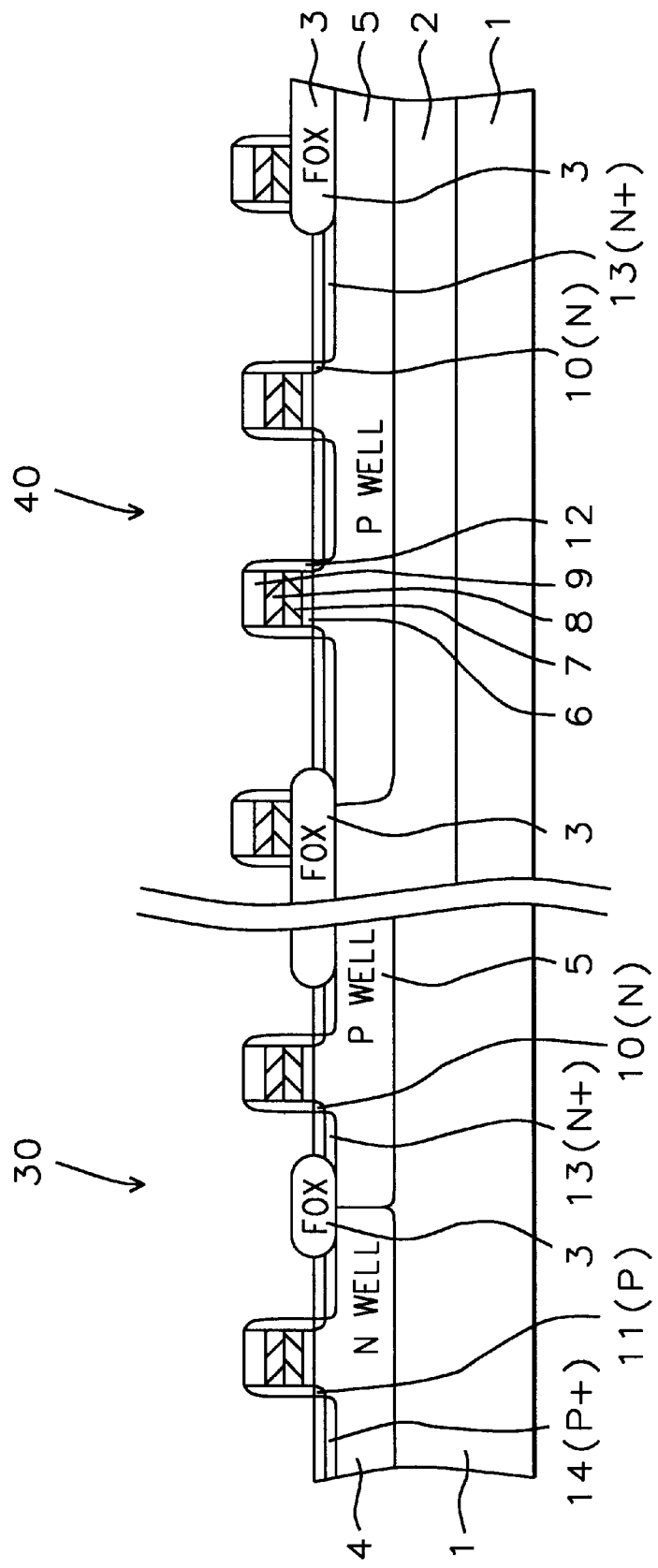

FIG. 2, schematically shows the formation of transfer gate transistors for the cell array 40, as well as for peripheral region 30. A gate insulator layer 6, of silicon dioxide is next thermally grown in a oxygen-steam ambient, at a temperature between about 850 to 950° C., to a thickness between about 50 to 200 Angstroms. A polysilicon layer 7, is then deposited using low pressure chemical vapor deposition, (LPCVD), processing, at a temperature between about 550 to 650° C., to a thickness between about 500 to 1500 Angstroms. Polysilicon layer 7, can either be grown using in situ doping techniques, via incorporation of either phosphine or arsine, in a silane ambient, or polysilicon layer 7, can be deposited intrinsically and doped via ion implantation of phosphorous, at an energy between about 50 to 100 KeV, at a dose between about 1E15 to 1E16 atoms/$cm^2$. A metal silicide layer 8, comprised of tungsten disilicide, is next deposited, again using LPCVD procedures, to a thickness between about 1000 to 1500 Angstroms, followed by the deposition of silicon nitride layer 9, obtained via LPCVD or plasma enhanced chemical vapor deposition procedures, to a thickness between about 1500 to 3000 Angstroms. A silicon oxide layer can also be used in place of a silicon nitride layer. Standard photolithographic and dry etching procedures, using $CHF_3$ as an etchant for silicon nitride layer 9, and using $Cl_2$ etchant as an etchant for metal silicide layer 8, and polysilicon layer 7, are used to produce the polycide, (metal silicide—polysilicon), gate structures.

After removal of the photoresist pattern, used to form the polycide structures, via plasma oxygen ashing and careful wet cleans, a photoresist blockout shape is formed allowing creation of N type lightly doped source and drain regions 10, in cell array region 40, and in the area of peripheral region 30, where N channel MOSFET devices will be formed. The ion implantation procedure used to create N type lightly doped source and drain regions 10, is the implantation of phosphorous ions, at an energy between about 40 to 100 KeV, at a dose between about 1E13 to 1E14 atoms/$cm^2$. This is shown schematically in FIG. 2. After removal of the photoresist blockout shape, used for the selective creation of the N type, lightly doped source and drain region, a similar photoresist blockout mask is used to allow P type, lightly doped source and drain region 11, shown schematically in FIG. 2, to be formed in an area of peripheral area 30, via ion implantation of boron, at an energy between about 5 to 20 KeV, at a dose between about 1E13 to 1E14 atoms/$cm^2$. After removal of this photoresist blockout shape, used for P type, lightly doped source and drain region 11, a layer of silicon nitride, or silicon oxide, is deposited using LPCVD or PECVD procedures, to a thickness between about 500 to 1500 Angstroms. An anisotropic RIE procedure is then employed to create silicon nitride spacers 12, on the sides of all polycide gate structures. Photoresist blockout shapes are again employed, using the identical sequence previously used for creation of N type, and P type, lightly doped source and drain regions, to allow selective formation of N type, heavily doped source and drain regions 13, as well as the selective formation of P type, heavily doped source and drain region 14, shown schematically in FIG. 2. Heavily doped, N type source and drain regions 13, are formed via ion implantation of phosphorous or arsenic, at an energy between about 50 to 100 KeV, at a dose between about 1E15 to 5E15 atoms/$cm^2$, while the heavily doped P type source and drain region 14, is obtained via ion implantation of boron, at an energy between about 5 to 20 KeV, at a dose between about 1E15 to 5E15 atoms/$cm^2$. Removal of the photoresist blockout shapes is accomplished via plasma oxygen ashing and careful wet cleans.

Figure 3:
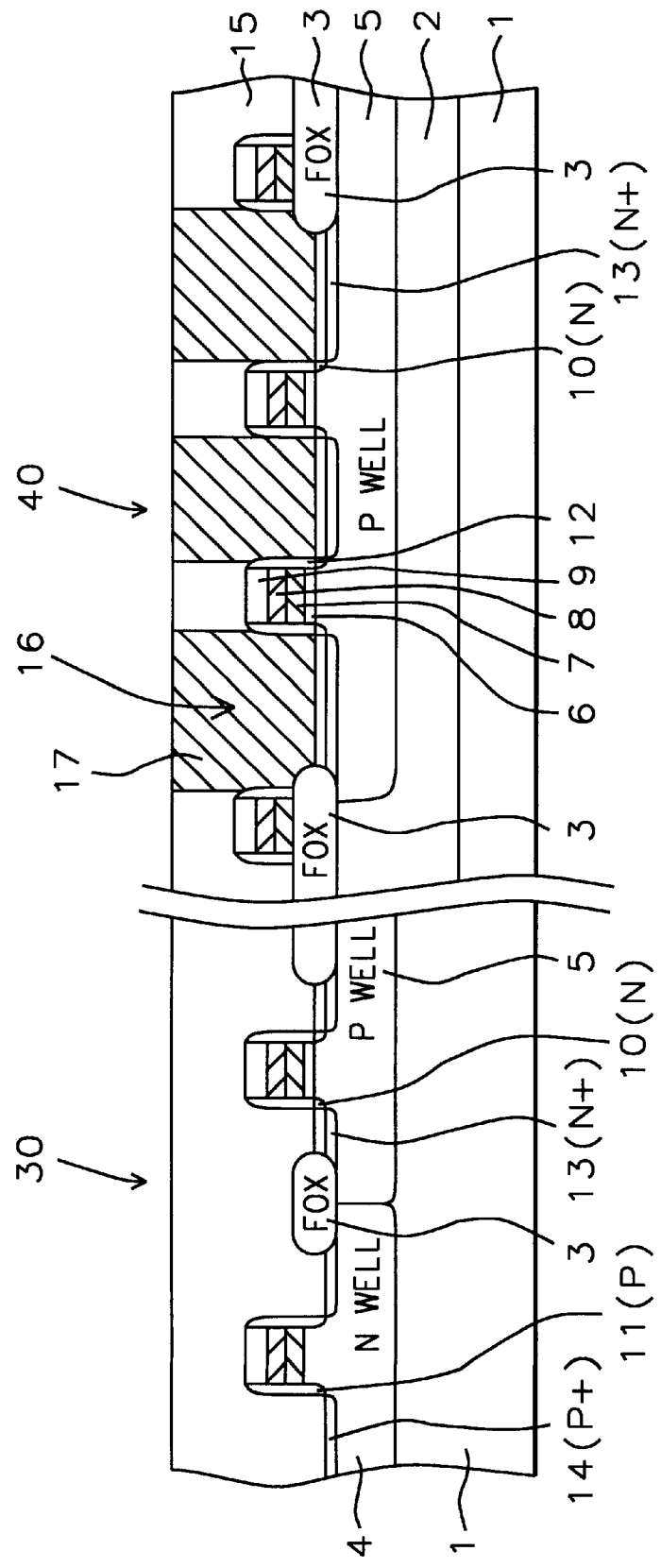
Figure 4:
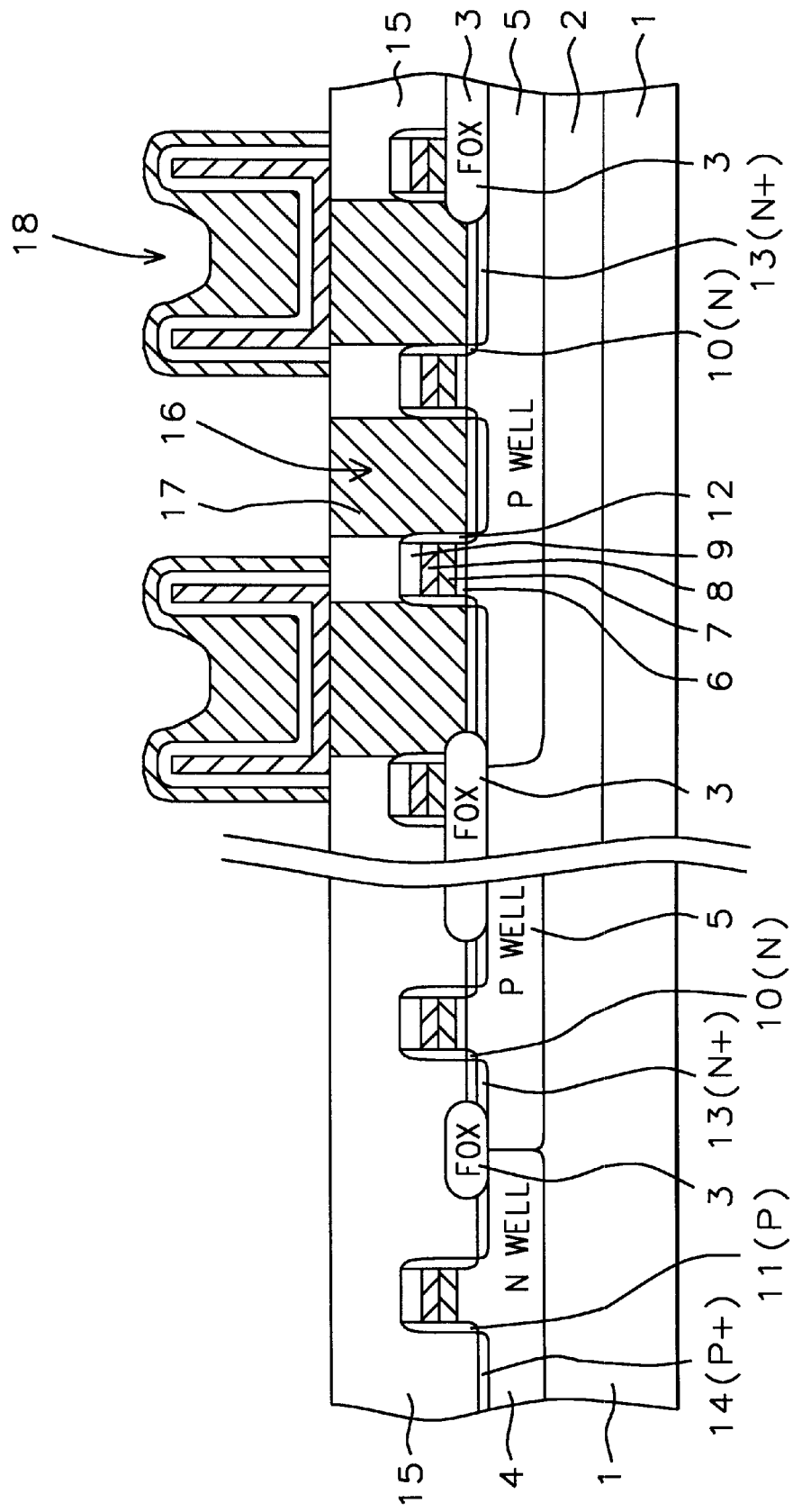

An insulator layer 15, of silicon oxide, is next deposited using LPCVD or PECVD procedures, to a thickness between about 5000 to 10000 Angstroms. Insulator layer 15, may also be a boro-phosphosilicate glass, (BPSG), a borosilicate glass, (BSG), or a phosphosilicate glass, (PSG). Planarization of insulator layer 15, is achieved via a chemical mechanical polishing, (CMP), procedure, resulting in a smooth topography for insulator layer 15. This is schematically shown in FIG. 3. Conventional photolithographic and anisotropic RIE procedures, using $CHF_3$ as an etchant, are used to open contact holes 16, in insulator layer 15, exposing N type, heavily doped source and drain regions 13, in cell array region 40. After removal of the photoresist shape, used for the creation of contact holes 16, a player of polysilicon is deposited, via LPCVD procedures, to a thickness between about 2000 to 4000 Angstroms, completely filling contact holes 16. The polysilicon layer can be in situ doped during deposition, via the addition of either arsine or phosphine, to a silane ambient, or the polysilicon layer can be deposited intrinsically, and doped via ion implantation of arsenic or phosphorous. Removal of unwanted polysilicon is accomplished using either a CMP procedure, or a selective RIE procedure, using $Cl_2$ as an etchant, creating polysilicon contact plug structress 17, in contact holes 16. This is schematically shown in FIG. 3.

Stacked capacitor structures, (STC), 18, are next formed on the top surface of those polysilicon contact plug structures 17, that will be used for communication with the capacitor structure. Briefly STC structures 18, are formed by first forming a U-shaped, polysilicon storage node electrode, on the top surface of polysilicon contact plug structures 17, offering increased surface when compared to flat storage node electrode shapes. The U-shaped polysilicon storage electrode is formed via a blanket, first polysilicon deposition, a formation of an insulator shape on the blanket polysilicon layer, followed by a second polysilicon deposition. An anisotropic RIE procedure, creates polysilicon spacers on the sides of the insulator shape, followed by a wet etching procedure, used to remove the exposed insulator shape, resulting in the U-shaped, polysilicon storage node structure, comprised of polysilicon spacers, connected to an underlying first polysilicon shape. A capacitor dielectric layer is next formed on the U-shaped storage node electrode, followed by the creation of overlying, polysilicon cell plate electrode, formed via LPCVD deposition of another polysilicon layer, and by photolithographic and RIE procedures.

Figure 5:
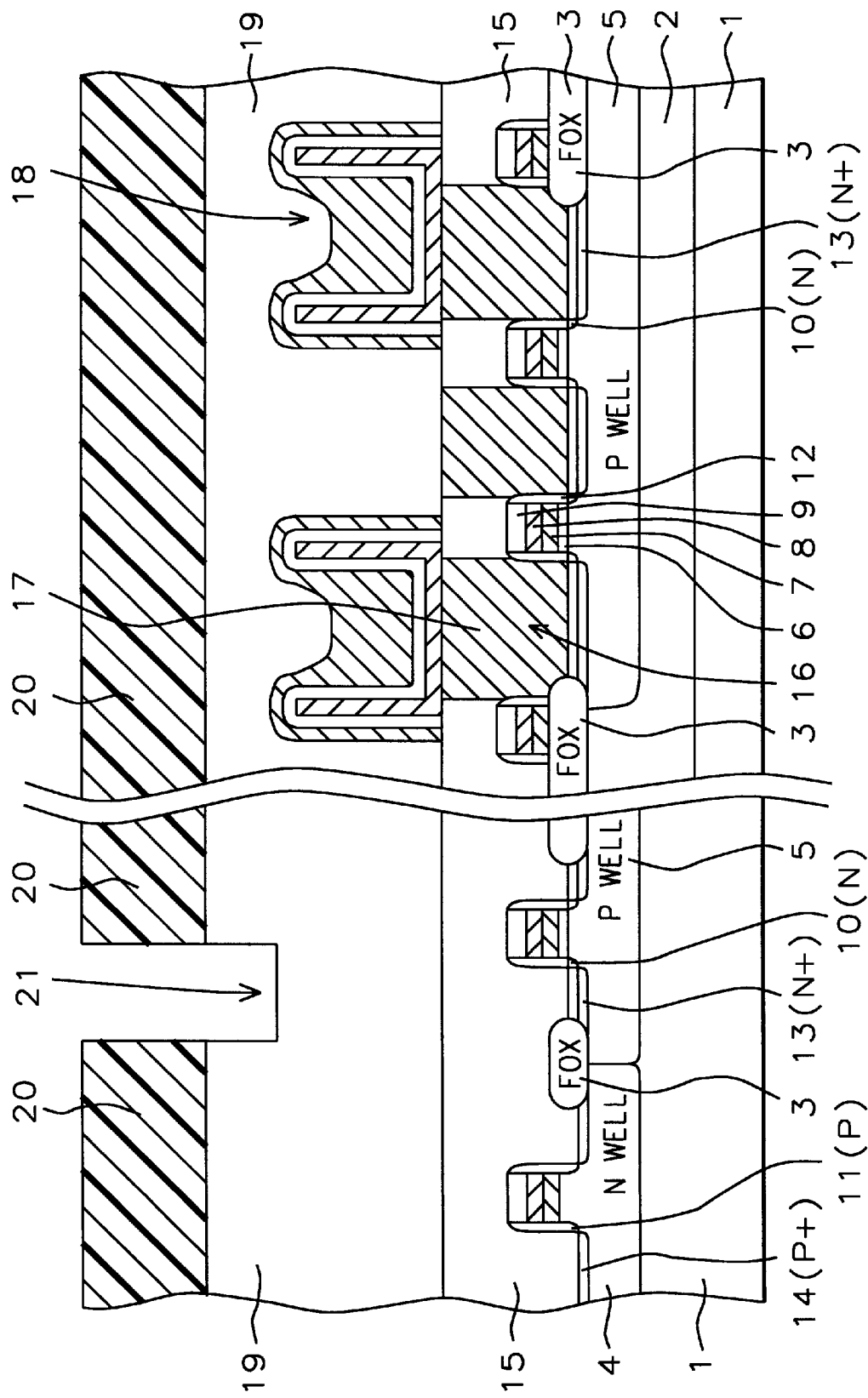
Figure 6:
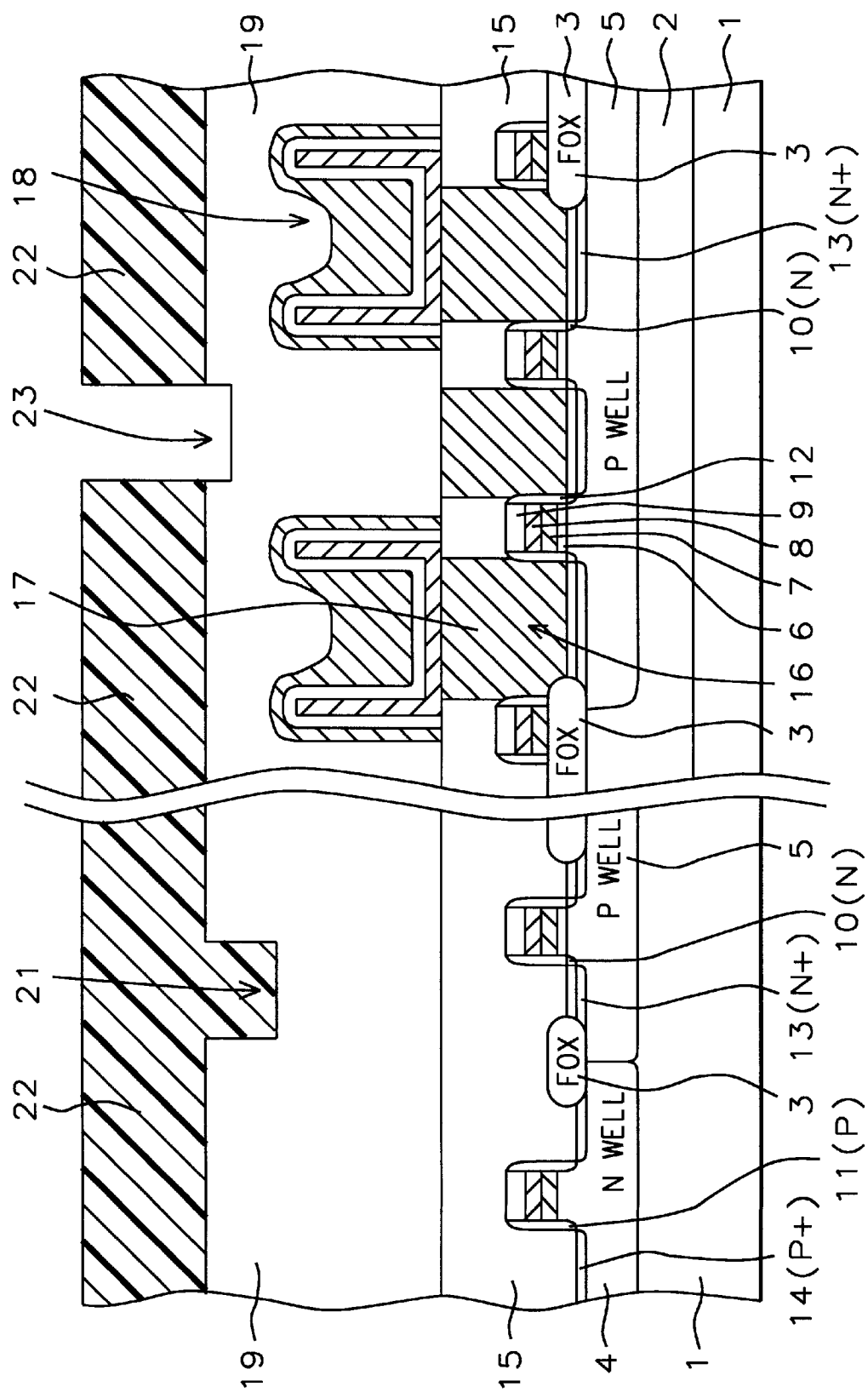

Another insulator layer 19, comprised of silicon oxide layer, BPSG, or PSG, is deposited using LPCVD or PECVD processing, at a temperature between about 400 to 700° C., to a thickness between about 10000 to 15000 Angstroms. A planarization procedure can again be employed, using CMP procedures, to obtain a smooth topography for insulator layer 19. Photoresist shape 20, is next formed, allowing exposure of insulator layer 19, only in peripheral region 30. An anisotropic RIE procedure, using $CHF_3$ as an etchant, is performed, resulting in the creation of opening 21, in insulator layer 19, shown schematically in FIG. 5. The depth of opening 21, in insulator layer 19, is between about 4000 to 6000 Angstroms. Opening 21, will subsequently be the dep trench shape, of a damascene opening, and will subsequently be filled with bit line metal. The depth of opening 21, between about 4000 to 6000 Angstroms, when filled with metal, will result in a low resistance bit line structure. After removal of photoresist shape 20, via plasma oxygen ashing and careful wet cleans, photoresist shape 22, is formed, allowing exposure of insulator layer 19, only in cell array region 40. Another anisotropic RIE procedure, again using $CHF_3$ as an etchant, is used to create opening 23, in insulator layer 19. This is schematically shown in FIG. 6. The depth of opening 23, in insulator layer 19, is only between about 750 to 1200 Angstroms. Opening 23, will be used as the shallow trench shape, for a damascene opening, to be used for bit line structures in cell array region 40. However the metal filled, shallow trench, will allow less coupling capacitance to occur, for tightly packed bit line structures in the high density cell array, than would have occurred if a metal filled, deeper trench, were used.

Figure 7:
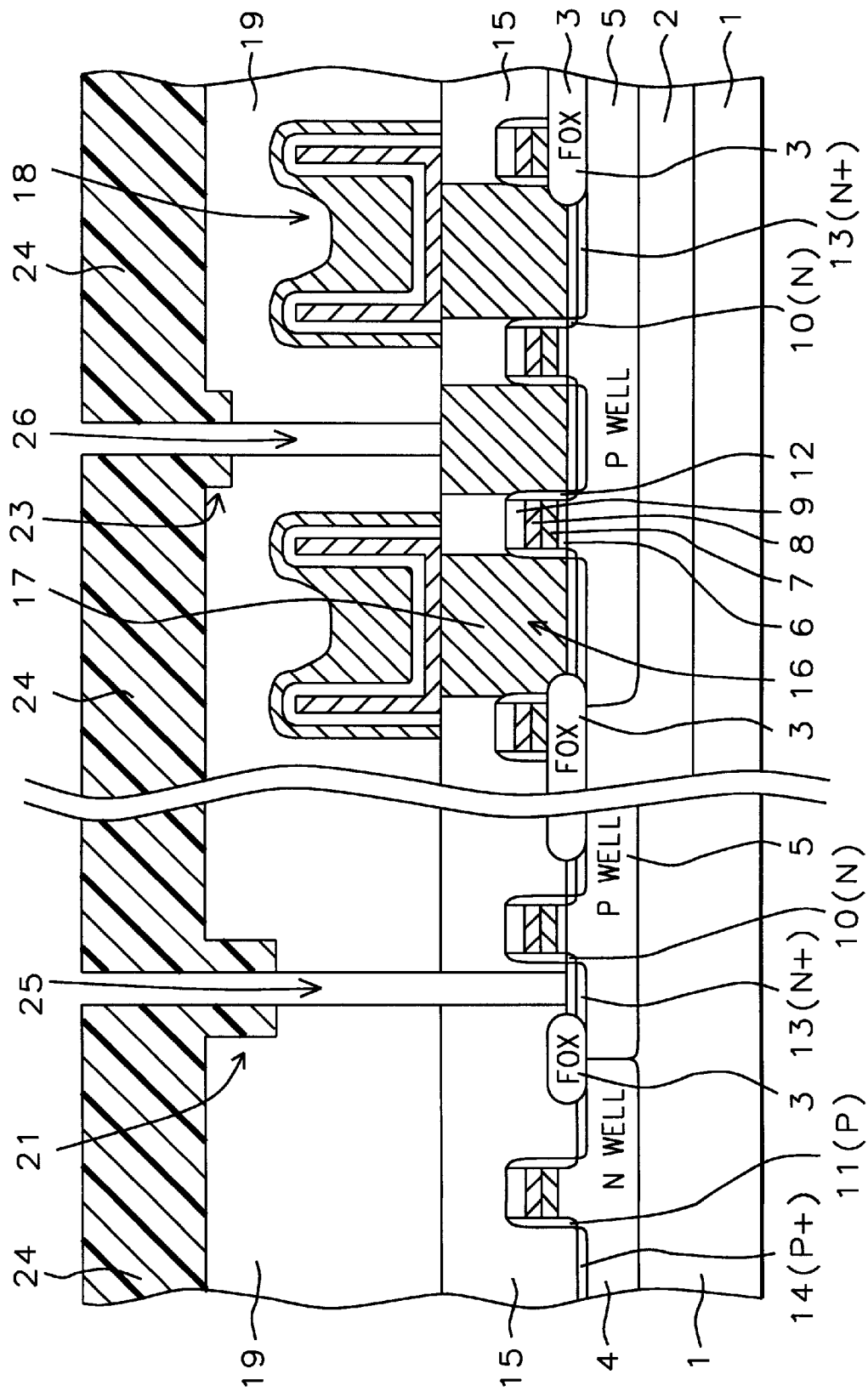

After removal of photoresist shape 22, via plasma oxygen ashing and careful wet cleans, photoresist shape 24, is formed, allowing the narrow openings, of the damascene opening, to be created, via an anisotropic RIE procedure, using $CHF_3$ as an etchant. The RIE procedure results in narrow opening 26, being formed in insulator layer 19, exposing the top surface of polysilicon contact plug structure 17, which in turn contacts underlying source and drain region 13, in cell array region 40. The same RIE procedure also results in narrow opening 25, in insulator layer 19, and in insulator layer 15, exposing source and drain region 13, in peripheral region 30. The additional etching needed to create the deeper, narrow opening 25, compared to narrow opening 26, is accomplished without attack of polysilicon contact plug structure 17, as a result of the selectivity of the $CHF_3$ etchant. This is schematically shown in FIG. 7.

Figure 8:
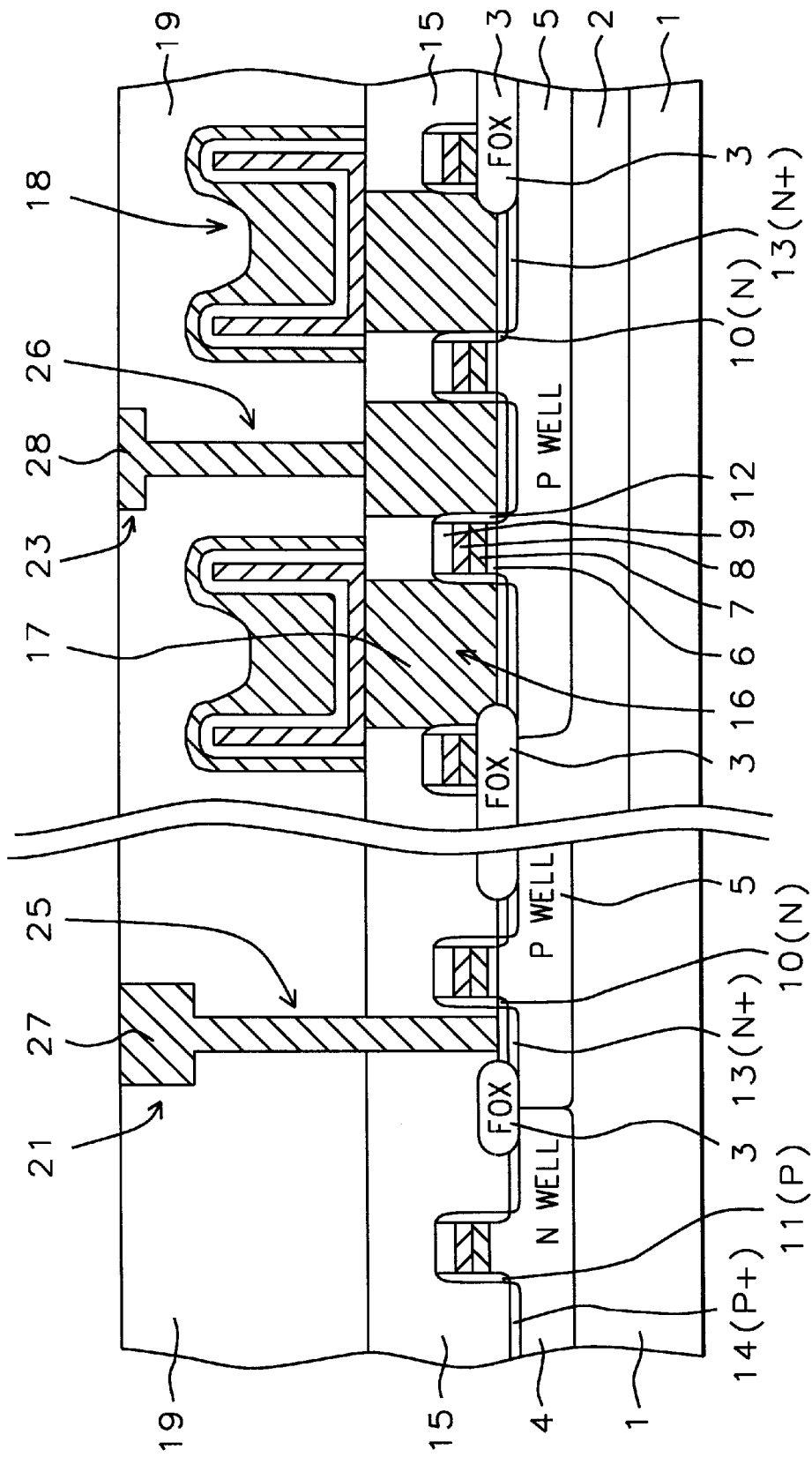

After removal of photoresist shape 24, accomplished again via plasma oxygen ashing and careful wet cleans, a metal deposition is performed, using chemical vapor deposition, or r.f. sputtering procedures, to a thickness between about 4000 to 6000 Angstroms, completely filling the damascene openings. The metal can be an aluminum based metallization, containing copper and silicon, or a refractory metal, such as tungsten, or a metal silicide layer, such as tungsten disilicide. A CMP procedure is next used to remove unwanted portions of metal, resulting in the desired bit line structures. The bit line structure, used in peripheral regions 30, is comprised of the metal filled, deep trench shape 27, between about 4000 to 6000 Angstroms in thickness, resulting in a low resistance bit line structure. The metal filled, shallow trench 28, used for bit line structures in cell array region 40, between about 750 to 1250 Angstroms in thickness, will result in a reduced level of coupling capacitance, when compared to counterparts fabricated with metal filled, deeper trenches. This is shown schematically in FIG. 8. Contact holes, and contacting metal structures, are also formed to capacitor structures 18, however not shown in the drawings.

While this invention has been particularly shown and described with reference to, the preferred embodiments thereof, it will be understood by those skilled in the art that various changes in form and detail may be made without departing from the spirit and scope of this invention.

What is claimed is:

1. A method for fabricating damascene bit line structures, for peripheral and cell array regions, of a semiconductor chip, comprising the steps of:

providing a first region of a semiconductor substrate, to be used as a peripheral region, of said semiconductor chip;

providing a second region of said semiconductor substrate, to be used as a cell array region, of said semiconductor chip;

forming a first set of transfer gate transistors, comprised of gate structures on gate insulator layers, and source and drain regions, in said peripheral region, of said semiconductor chip;

forming a second set of transfer gate transistors, comprised of gate structures on gate insulator layers, and source and drain regions, in said cell array region, of said semiconductor chip;

forming polysilicon contact plug structures, in a contact hole in a first insulator layer, in said cell array region, contacting underlying, said source and drain region, of said second set of transfer gate transistors;

forming capacitor structures on a first set of said polysilicon contact plug structures;

depositing a second insulator layer;

forming a first damascene opening in said second insulator layer, and in said first insulator layer, in said peripheral region, of said DRAM chip, with said first damascene opening comprised of two parts, a top part comprised of a wide, deep trench opening, in said second insulator layer, and a bottom part, comprised of a narrow opening in said second insulator layer, and in said first insulator layer, exposing said source and drain region, of said first set of transfer gate transistors;

forming a second damascene opening in said second insulator layer, in said cell array region of said DRAM chip, with said second damascene opening comprised of two parts, a top part comprised of a wide, shallow trench opening, in said second insulator layer, and a bottom part, comprised of a narrow opening in said second insulator layer, exposing the top surface of a second set of said polysilicon contact plug structures;

forming a first bit line structure, in said first damascene opening, comprised of a thick metal shape, in said wide, deep trench opening, and a bottom part, comprised of a metal plug, in said narrow opening, contacting said source and drain region, of said first set of transfer gate transistors; and forming a second bit line structure, in said second damascene opening, comprised of a thin metal shape, in said wide, shallow opening, and a bottom part, comprised of a metal plug, in said narrow opening, contacting the top surface of said second set of said polysilicon contact plug structures.

2. The method of claim 1, wherein said first insulator layer, can be a silicon oxide layer, a BPSG layer, a BSG layer, or a PSG layer, deposited using LPCVD or PECVD procedures, to a thickness between about 5000 to 10000 Angstroms.

3. The method of claim 1, wherein said second insulator layer can be a silicon oxide layer, a BPSG layer, a BSG layer, or a BPSG layer, deposited using LPCVD or PECVD procedures, to a thickness between about 10000 to 15000 Angstroms.

4. The method of claim 1, wherein said first damascene opening is formed in said second insulator layer, and in said first insulator layer, using anisotropic RIE procedures, using $CHF_3$ as an etchant.

5. The method of claim 1, wherein said second damascene opening is formed in said second insulator layer, using anisotropic RIE procedures, using $CHF_3$ as an etchant.

6. The method of claim 1, wherein said wide, deep trench opening, in top part of said first damascene opening, is between about 4000 to 6000 Angstroms in depth.

7. The method of claim 1, wherein said wide, shallow trench opening, in top part of said second damascene opening, is between about 750 to 1250 Angstroms in depth.

8. The method of claim 1, wherein said thick metal shape, of said first bit line structure, located in said wide, deep trench opening of said first damascene opening, is comprised of an aluminum based metallization layer, at a thickness between about 4000 to 6000 Angstroms.

9. The method of claim 1, wherein said thin metal shape, of said second bit line structure, located in said wide, shallow trench opening in said second damascene opening, is comprised of an aluminum based metallization layer, at a thickness between about 750 to 1250 Angstroms.

10. A method for fabricating a DRAM chip, on a semiconductor substrate, featuring low resistance bit line structures, in a peripheral region of said DRAM chip, and featuring bit line structures with low bit line to bit line coupling capacitance, in a cell array region of said DRAM chip, comprising the steps of:

providing a first region of said semiconductor substrate, to be used for said peripheral region of said DRAM chip;

providing a second region of said semiconductor substrate, to be used for said cell array region of said DRAM chip;

forming a first set of transfer gate transistors, in said peripheral region of said DRAM chip, comprised of polycide gate structures on silicon dioxide gate layers, and source and drain regions;

forming a second set of transfer gate transistors, in said cell array region of said DRAM chip, comprised of polycide gate structures on silicon dioxide gate insulator layers, and source and drain regions;

depositing a first insulator layer;

planarizing said first insulator layer;

opening contact holes in said first insulator layer, exposing source and drain regions of said second set of transfer gate transistors, in said cell array region, of said DRAM chip;

depositing a polysilicon layer;

patterning of said polysilicon layer to form polysilicon contact plug structures, in said contact holes;

forming stacked capacitor structures on a first set of said polysilicon contact plug structures;

depositing a second insulator layer;

planarizing said second insulator layer;

forming a wide, deep trench opening in a top portion of said second insulator layer, in said peripheral region of said DRAM chip;

forming a wide, shallow opening in top portion of said second insulator layer, in said cell array region of said DRAM chip;

forming a narrow opening in bottom portion of said second insulator layer, and in said first insulator layer, resulting in a first damascene opening, comprised of a wide, deep trench shape, and an underlying, narrow shape, exposing a source and drain region of said first set of transfer gate transistors, in said peripheral region of said DRAM chip;

forming a narrow opening in said bottom portion of said second insulator layer, resulting in a second damascene opening, comprised of a wide, shallow shape, and an underlying, narrow shape, in said second insulator layer, exposing a second set of polysilicon contact plug structures, in said cell array region of said DRAM chip;

depositing a metal layer;

removing said metal layer from the top surface of said second insulator layer, in said peripheral region of said DRAM chip, resulting in said low resistance bit line structure, in said first damascene opening, comprised of a thick metal shape, in said wide, deep trench opening, overlying a narrow metal plug, in said narrow opening, contacting said source and drain region, in said first set of transfer gate transistors chip; and removing said metal layer from the top surface of said second insulator layer, in said cell array region of said DRAM chip, resulting in bit line structures in said second damascene opening, with low bit line to bit line coupling capacitance, comprised of a thin metal shape, in said wide, shallow trench opening, overlying a metal plug, in said narrow opening, and contacting the top surface of said second set of said polysilicon contact plug structures.

11. The method of claim 10, wherein said polycide gate structures are comprised of an overlying tungsten disilicide layer, at a thickness between about 1000 to 1500 Angstroms, and an underlying polysilicon layer, at a thickness between about 500 to 1500 Angstroms.

12. The method of claim 10, wherein said first insulator layer is chosen from a group that includes, silicon oxide, BSG, BPSG, or PSG, obtained via LPCVD or PECVD procedures, at a thickness between about 5000 to 10000 Angstroms.

13. The method of claim 10, wherein said contact holes are formed in said first insulator layer, in said cell array region of said DRAM chip, via an anisotropic RIE procedure, using $CHF_3$ as an etchant.

14. The method of claim 10, wherein said polysilicon contact plug structures are formed in said contact holes, via deposition of a polysilicon layer, at a thickness between about 2000 to 4000 Angstroms, using LPCVD procedures, followed by patterning using an anisotropic RIE procedure, using $Cl_2$ as an etchant, or patterned via use of a CMP procedure.

15. The method of claim 10, wherein said second insulator layer is chosen from a group that includes silicon oxide, BSG, BPSG, and PSG, obtained via PECVD or LPCVD procedures, to a thickness between about 10000 to 15000 Angstroms.

16. The method of claim 10, wherein said first damascene opening is formed in said second insulator layer, and in said first insulator layer, in said peripheral region of said DRAM chip, via an anisotropic RIE procedure, using $CHF_3$ as an etchant.

17. The method of claim 10, wherein said second damascene opening is formed in said second insulator layer, in said cell array region of said DRAM chip, using $CHF_3$ as an etchant.

18. The method of claim 10, wherein said wide, deep trench opening, in the top portion said first damascene opening, is formed in said second insulator layer, to a depth between about 4000 to 6000 Angstroms.

19. The method of claim 10, wherein said wide, shallow trench opening, in said top portion of said second damascene opening, is formed in said second insulator layer, to a depth between about 750 to 1250 Angstroms.

20. The method of claim 10, wherein said metal layer is chosen from a group that includes an aluminum based layer, a tungsten layer, or a tungsten silicide layer.

21. The method of claim 10, wherein said low resistance bit line structure, in said peripheral region of said DRAM chip, is comprised of said thick metal shape, between about 4000 to 6000 Angstroms in thickness, overlying said narrow metal plug, with said narrow metal plug contacting said source and drain region, of said first set of transfer gate transistors.

22. The method of claim 10, wherein said bit line structures, with low bit line to bit line coupling capacitance, in said cell array region of said DRAM chip, are comprised of said thin metal shape, between about 750 to 1250 Angstroms in thickness, overlying said narrow metal plug, with said metal plug contacting the top surface of said second set of said polysilicon contact plug structures.

* * * * *